United States Patent
Fujishima et al.

[11] Patent Number: 5,612,564
[45] Date of Patent: Mar. 18, 1997

[54] SEMICONDUCTOR DEVICE WITH LIMITER DIODE

[75] Inventors: Naoto Fujishima; Gen Tada, both of Kawasaki, Japan

[73] Assignee: Fuji Electric Co., Ltd., Tokyo, Japan

[21] Appl. No.: 369,772

[22] Filed: Jan. 6, 1995

[30] Foreign Application Priority Data

Jan. 6, 1994 [JP] Japan .................................. 6-000176

[51] Int. Cl.[6] .......................... H01L 29/76; H01L 31/062
[52] U.S. Cl. ......................... 257/341; 257/401; 257/601; 257/603
[58] Field of Search ................................. 257/341, 401, 257/601, 603

[56] References Cited

U.S. PATENT DOCUMENTS

| | | | |
|---|---|---|---|
| 5,077,590 | 12/1991 | Fujihira | 257/603 |
| 5,204,988 | 4/1993 | Sakurai | 257/603 |
| 5,336,920 | 8/1994 | Jimenez | 257/603 |
| 5,357,126 | 10/1994 | Jimenez | 257/603 |
| 5,442,216 | 8/1995 | Gough | 257/341 |
| 5,475,252 | 12/1995 | Merrill et al. | 257/341 |

FOREIGN PATENT DOCUMENTS

4-107878  4/1992  Japan .

*Primary Examiner*—Sara W. Crane
*Assistant Examiner*—David Ostrowski
*Attorney, Agent, or Firm*—Brumbaugh, Graves, Donohue & Raymond

[57] ABSTRACT

A semiconductor device with a metal-insulator-semiconductor transistor and a limiter or sacrifice diode has predetermined breakdown voltage and constant withstand voltage. The device includes a special well region underlying a drain portion or contacting an edge of a drain portion.

8 Claims, 11 Drawing Sheets

SEMICONDUCTOR DEVICE WITH LIMITER DIODE

BACKGROUND OF THE INVENTION

The present invention relates to a semiconductor device comprising a metal-insulator-semiconductor field effect transistor and, more specifically, to a power MISFET structure with high withstand voltage.

Recently, power IC's have been developed that integrate a MOSFET or insulated gate field effect transistor having a withstand voltage of several hundred volts and having a current capacity or withstand capability of several amperes, with a control circuit operating at a voltage of around 5 volts. Some of the developed power IC's have already been used in switching power supplies as disclosed in the Japanese Laid Open Patent Application No. S63-314869.

Figure 11:
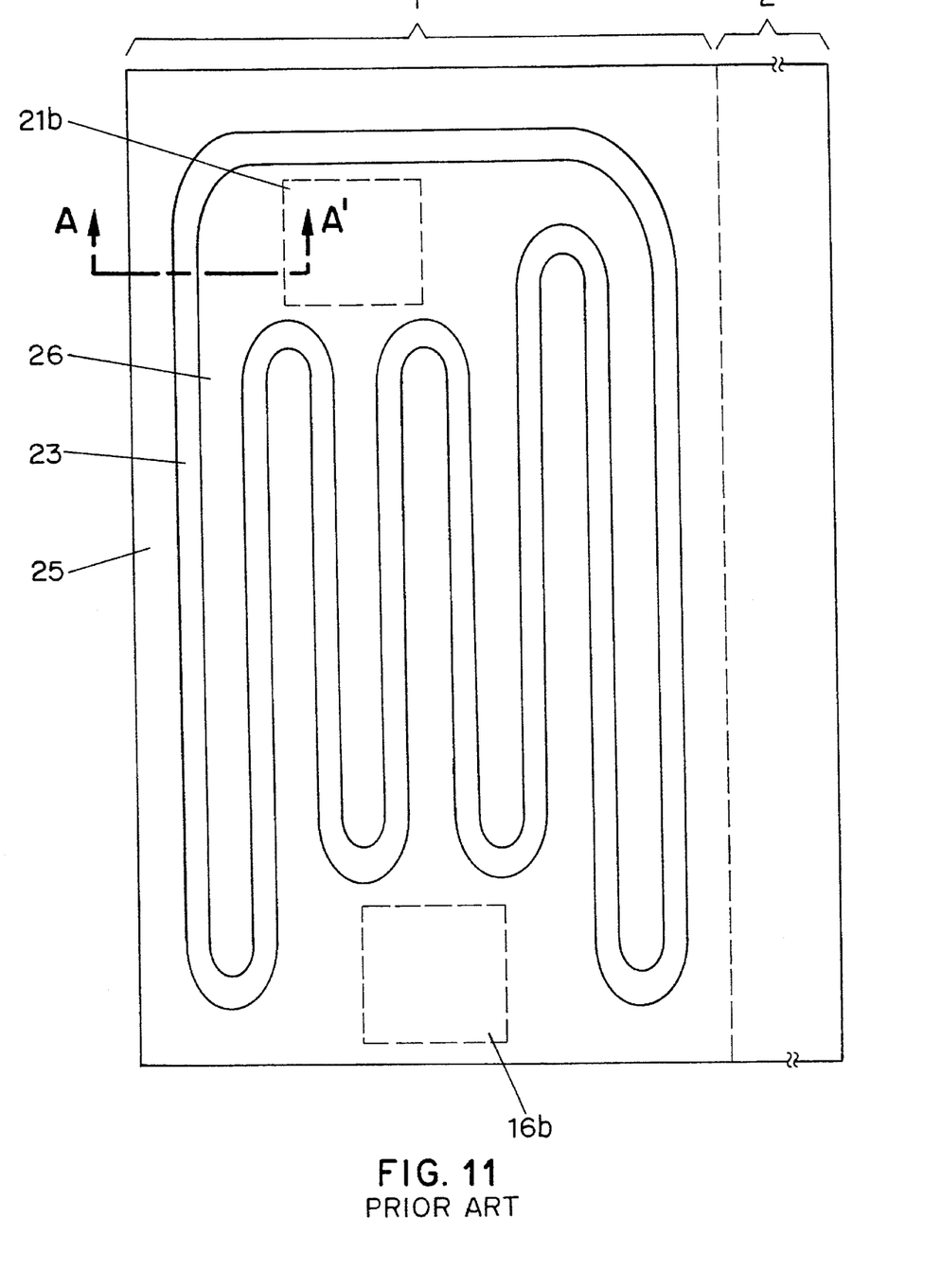
FIG. 11 is a top plan view showing a prior-art device.
Figure 12:
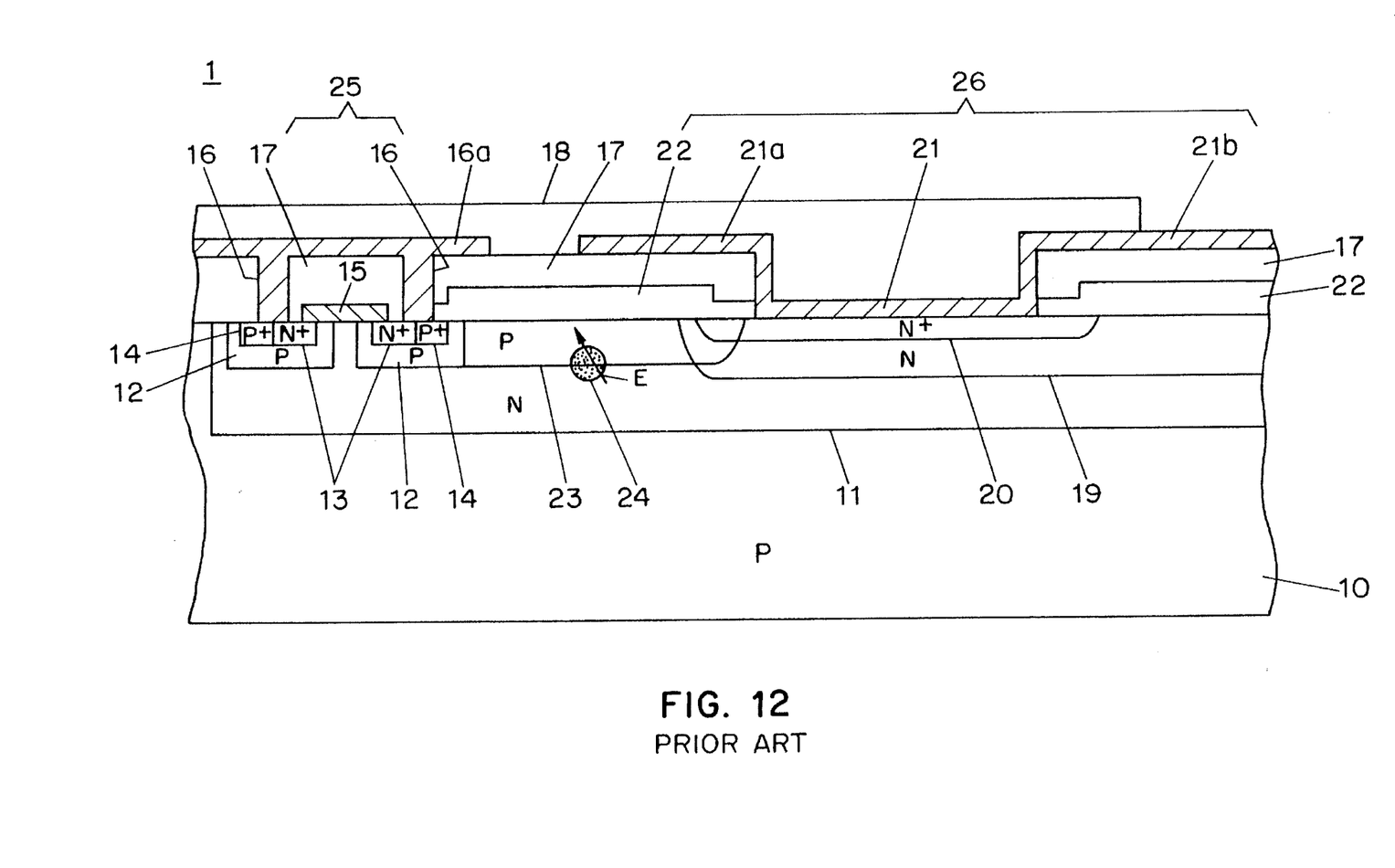
FIG. 12 is a sectional view taken along A–A' of FIG. 11.

FIGS. 11 and 12 show a power IC disclosed in the Japanese Laid Open Patent Application No. H04-309920 by the inventors of the present invention. This power IC comprises a power MOSFET portion 1 and a control circuit portion 2 formed on a semiconductor chip. The sectional structure of the power MOSFET portion 1 is shown in FIG. 12. The power MOSFET portion 1 is a transverse DMOSFET comprising a MOS portion 25 and a drain portion 26 formed on an N-type well layer 11 disposed on a P-type semiconductor substrate 10. In the MOS portion 25, a pair of mutually separated P-type base layers 12 are formed, at whose surface an inversion layer (channel) is to be formed. An $N^+$-type source layer 13 and a $P^+$-type base contact layer 14 are disposed on the first P-type base layer 12. A polysilicon gate electrode 15 bridging a pair of the source layers 13 is disposed on a gate insulation film (not shown). A source electrode 16 is connected with the source layers 13 and the base contact layers 14 through contact holes. The source electrode 16 has a field plate portion 16a protruding toward the drain portion 26 to create a high withstand voltage structure which relieves concentration of an electric field to an edge portion of the source layer 12. A reference numeral 17 designates an inter-layer insulation film, and 18 a passivation film.

In the drain portion 26, an N-type base layer 19 functions as a drain layer and is disposed on the N-type well layer 11. An $N^+$-type base contact layer 20 is in turn disposed on a portion of the N-type base layer 19. A drain electrode 21 is connected to the base contact layer 20 through a contact hole. The drain electrode 21 has a field plate portion 21a protruding toward the MOS portion 25 to create a high withstand voltage structure which relieves concentration of an electric field to an edge portion of the N-type base layer 19. A reference numeral 22 designates a thick insulation film such as LOCOS local oxide film. Between the MOS portion 25 and the drain portion 26, the second P-type base layer 23 is disposed on the N-type well layer 11 bridging the first P-type base layer 12 and the N-type base layer 19.

The second P-type base layer 23, or offset layer, lies between the MOS portion 25, including the underlying part and periphery of the gate electrode 15, and the drain portion 26, including the underlying part and periphery of the drain electrode 21. Thus, the second P-type base layer 23 is folded like comb teeth on the chip as shown in FIG. 11 and defines the boundary between the MOS portion 25 and the drain portion 26. The MOS portion 25, including the source pad 16b, is formed outside the boundary, i.e., the second P-type base layer 23, while the drain portion 26, including the drain pad 21b, is formed inside the boundary.

The reason for connecting the P-type base layer 23 to the P-type base layer 12 and extending the P-type base layer 23 into the edge portion of the N-type base layer 19, is as follows:

(1) When the MOSFET is ON, i.e., when the gate electrode 15 is biased with a potential higher than the source potential and the drain electrode with a high potential, an inversion layer is formed in the surface of the first base layer 12 underneath the gate electrode 15, while electrons, the majority carrier, flow out from the source layer 13 to the N-type well layer 11 under the gate electrode 15 through the channel. Similar to a vertical DMOSFET, the electrons flow downward in the N-type well layer 11 under the gate electrode 15, and then flow horizontally along the N-type well layer 11 to the N-type base or drain layer 19. Though the electrons are absorbed by the drain electrode 21 through the drain contact layer 20, when a large current flows in a DMOSFET which lacks the P-type base layer 23 on the N-type well layer 11 as a horizontal current path, hot electrons are injected into the insulation film 22 to cause time dependent variation of the electric field and degradation of the reliability of the device. However, the influence of the hot electrons can be ignored, because the junction between the P-type base layer 23 and the N-type well layer 11 is reverse-biased and the electrons flowing in the N-type well layer 11 do not contact the insulation film 22 as long as the P-type base layer 23 exists.

(2) When the MOSFET is OFF, i.e., when the forward current flow is shut off, with the gate electrode 15 biased with low potential, e.g., a source potential or ground potential, while the drain electrode 21 is biased with high potential, then, since the junction between the first P-type base layer 12 or the second P-type base layer 23 and the N-type well layer 11, and the junction between the N-type well layer 11 and the P-type semiconductor substrate 10 are reverse-biased, depletion layers spread from the junctions into the N-type well layer 11. Taking into consideration the depletion layers spreading from the first P-type base layer 12 and the substrate 10 on the side of the N-type base layer (drain layer) 19, the inside of the well layer 11 near under the gate electrode 15 is pinched off and the current path is shut off as in a JFET. Additionally, if the depletion layers spread from the second P-type base layer 23 and the substrate 10 under consideration, the inside of the well layer 11 under the second P-type base layer 23 is pinched off, shutting off the current path as in a JFET.

Thus, the current path is assuredly shut off inside the well layer 11 by the JFET effect of the second P-type base layer 23 when the reverse bias voltage is applied. Therefore, for securing the withstand voltage, it is not necessary to elongate the offset region, i.e., the region between the first base layer 12 and the N-type base layer 19, with low dopant concentrations of the N-type well layer 11, and the MOSFET can be provided with a higher withstand voltage and its ON-resistance can be lowered by doping the N-type well layer 11 with relatively high impurity concentrations.

However, the above described transverse DMOSFET provided with a second base layer 23 which covers the offset region has several drawbacks. First, though the pinch off occurs under the second base layer 23 when the forward current flow is shut off, avalanche breakdown occurs in region 24 as the drain potential is further raised, because of the concentration of an electric field E, the direction of which is indicated by an arrow in FIG. 12, in the junction portion 24 under the edge of the field plate portion 21a between the second base layer 23 under the N⁻-type well layer 11. Avalanche breakdown also occurs because the region 24 (hereinafter referred to as "breakdown generation portion"), located near the edge of the field plate portion 21a and easily affected by edge electric field, is a portion in which the composite electric field E constituted of a vertical electric field between the second base layer 23 and the N-type well layer 11 and a horizontal electric field between the second base layer 23 and the N-type base layer 19 are at the maximum. As avalanche breakdown occurs in the region 24 in the rate determining manner as described above, some of the produced electrons are readily injected into the oxide film 22 and vary, as time elapses, the electric field distribution near the location at which the avalanche breakdown has occurred. The variation of the electric field distribution varies the breakdown voltage with elapse of time and deteriorates stability and reliability of the device. The avalanche breakdown spot and the breakdown voltage are easily varied by the diffusion extent and the dopant concentrations. Though the holes produced by the avalanche breakdown flow horizontally to a not shown PN junction separation layer, or isolation layer, they diverge before reaching the isolation layer and deteriorate the stability of the device, because the power MOSFET portion 1 occupies a large part of the chip area, as shown in FIG. 11.

In view of the foregoing, an object of the present invention is to provide a semiconductor device comprising a highly reliable MIS transistor which suppresses time dependent variation of its withstand voltage by adopting a semiconductor structure which facilitates fixing the breakdown voltage at a predetermined value.

SUMMARY OF THE INVENTION

The object of the present invention is achieved by provision of a limiter or sacrifice diode which assuredly breaks down at a predetermined voltage before the main power MISFET breaks down.

More in detail, the object of the present invention is achieved by a semiconductor device comprising a MIS field effect transistor which further comprises a semiconductor substrate of the first conductivity type, and a well region of the second conductivity type selectively disposed on the semiconductor substrate; a MIS portion further comprising a plurality of first base layers of the first conductivity type disposed in the well region, a plurality of source layers of the second conductivity type disposed on the first base layers, and a gate electrode, coupled with the first base layers as a back gate, disposed on a gate insulation film and bridging the source layers over the well region; a drain portion of the second conductivity type selectively disposed on the semiconductor substrate and connected with an edge portion of the well region; the second base layer of the first conductivity type selectively disposed on the well region and bridging one of the first base layers and the drain portion; and a well region of the first conductivity type selectively disposed on the drain portion more deeply than the drain portion.

The object of the present invention is also achieved by a semiconductor device comprising a MIS field effect transistor which further comprises a semiconductor substrate of the first conductivity type, and a well region of the second conductivity type selectively disposed on the semiconductor substrate; a MIS portion further comprising a plurality of first base layers of the first conductivity type disposed in the well region, a plurality of source layers of the second conductivity type disposed on the first base layers, and a gate electrode, coupled with the first base layers as a back gate, disposed on a gate insulation film and bridging the source layers over the well region; a drain portion of the second conductivity type selectively disposed on the semiconductor substrate and connected with an edge portion of the well region; the second base layer of the first conductivity type selectively disposed on the well region and bridging one of the first base layers and the drain portion; and a well region of the first conductivity type contacting with an edge portion of the drain portion.

Additionally, the PN junction of the junction diode, comprising the well region of the first conductivity type and the drain portion of the second conductivity type, may be parallel or perpendicular to the chip surface.

It is preferable to form the well region of the first conductivity type as a ring around a circular drain pad. It is also preferable to form the well region of the first conductivity type in a circle underneath a circular drain pad, or to form the well region of the first conductivity type in a circle underneath and around a circular drain pad.

The well region of the first conductivity type and the drain portion of the second conductivity type constitute a junction diode, the junction of which is parallel to the chip surface. When the MIS field effect transistor is OFF, a depletion layer spreads also from the junction. In the junction plane layer, breakdown starts from a finite spot before a depletion layer extends from the junction between the second base layer of the first conductivity type and the well region of the second conductivity type. Therefore, the withstand voltage of the MIS field effect transistor is fixed at a constant value and prevented from varying with elapse of time, because the junction diode, comprising the well region of the first conductivity type and the drain portion of the second conductivity type, functions as a withstand voltage limiter or sacrifice diode. Thus, a highly reliable MIS field effect transistor is obtained.

Since a large current cross section and a large current capacity are secured by the PN junction of the above described junction diode extending into a plane, large withstand capability against avalanche, caused by inductive load when the current is shut off, is also secured.

By forming the well region of the first conductivity type so that the well region contacts with the edge portion of the drain portion, the same effect as that described above is obtained. In addition, since the electric field is directed in parallel to the chip surface by the PN junction perpendicular to the chip surface, few electrons are injected into the surface insulation film, so that time dependent variation of the withstand voltage is minimized.

By forming the well region of the first conductivity type in a ring surrounding the circular drain pad, a sacrifice diode with withstand voltage lower than the withstand voltage of the main MIS is obtained, because the element area for the main MIS transistor can effectively be secured and the PN junction area can be enlarged. And, by forming the well region of the first conductivity type in a circle underneath the circular drain, the current capacity can be increased because the sacrifice diode can be formed without diminishing the element area for the main MIS transistor.

BRIEF DESCRIPTION OF THE DRAWINGS

In the following, the present invention will be described in detail with reference to the drawings which illustrate preferred embodiments of the present invention, wherein.

DETAILED DESCRIPTION OF PREFERRED EMBODIMENTS

Figure 1:
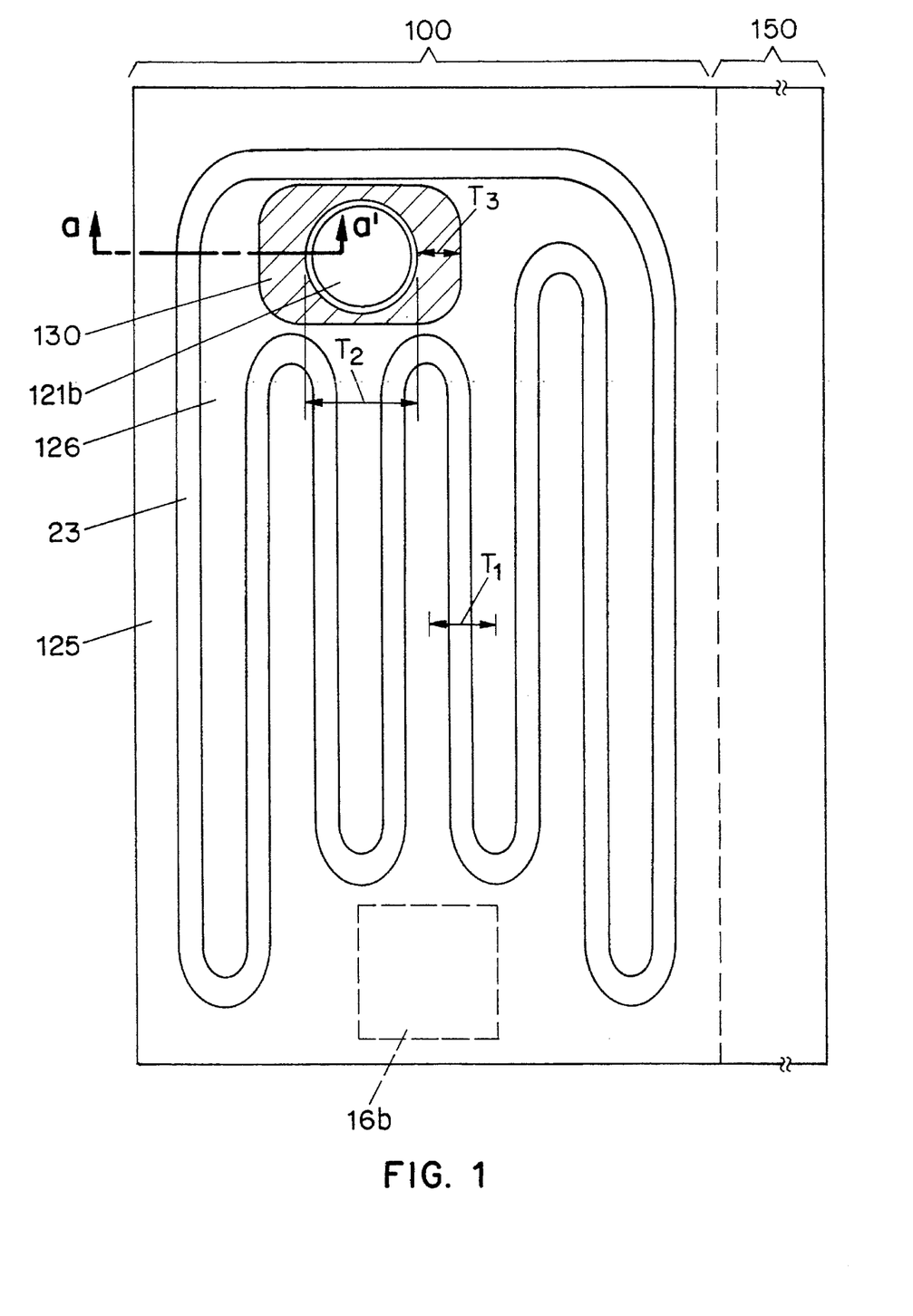
FIG. 1 is a top plan view showing a first embodiment of the power IC with a transverse DMOSFET according to the present invention.
Figure 2:
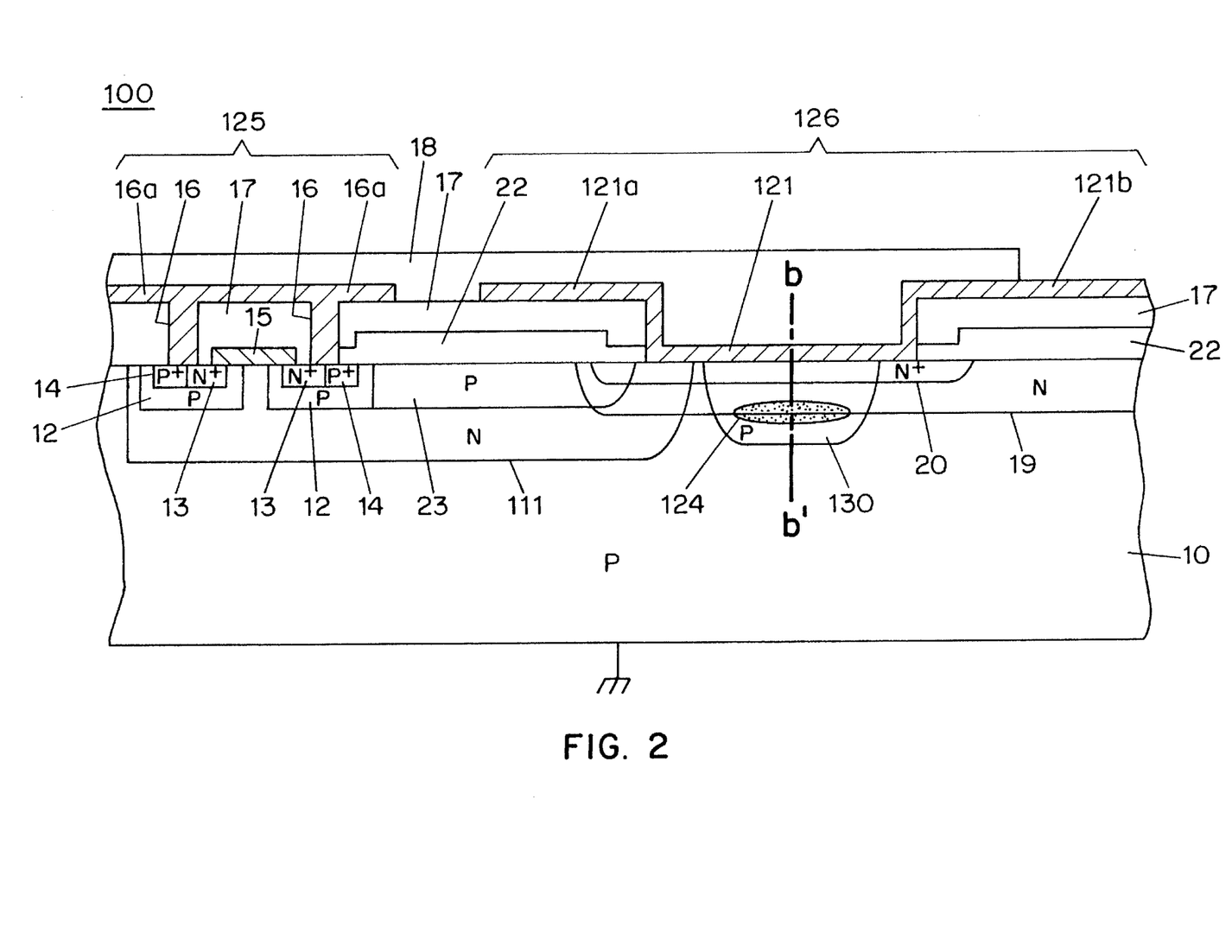
FIG. 2 is a sectional view taken along a–a' of FIG. 1.

The embodiment shown in FIG. 1 comprises a power MOSFET portion 100 and a control circuit 150 with low withstand voltage formed on a chip. The sectional view of the power MOSFET portion 100 is shown in FIG. 2. As shown in FIG. 2, the power MOSFET portion 100 is formed in a transverse DMOSFET having a double diffusion type MOS structure, and comprises a MOS portion 125 and a drain portion 126 selectively disposed on a P-type semiconductor substrate 10. In the MOS portion 125, a pair of the first P-type base layers, or channel diffusion layers, 12 are separated from each other by and disposed on an N-type well layer 111 on the P-type semiconductor substrate 10. Each base layer is formed with an interior channel. An N⁺-type source layer 13 and a P⁺-type base contact layer 14 are disposed in the channel within the first P-type base layer 12. A poly-silicon gate electrode 15 bridging a pair of the source layers 13 is disposed on a gate insulation film (not shown). A source electrode 16 is connected to the source layers 13 and the base contact layers 14 through contact holes. The source electrode 16 has a field plate portion 16a protruding toward the drain portion 126, which relieves concentration of an electric field to an edge portion of the source layer 12 by creating a high withstand voltage structure. A reference numeral 17 designates an inter-layer insulation film, and 18 a passivation film.

An offset portion of the N-type well layer 111, which forms a drain drift region, is extended into the drain portion 126 and connected with an N-type base, i.e., the drain layer, 19 disposed on the P-type semiconductor substrate 10. An N⁺-type base contact layer 20 is selectively disposed on the N-type base 19. A drain electrode 121 has a field plate portion 121a protruding toward the MOS portion 125, which relieves concentration of an electric field to an edge portion of the N-type base layer 19 by creating a high withstand voltage structure. Between the MOS portion 125 and the drain portion 126, the second P-type base layer 23 bridging the first P-type base layer 12 and the N-type base layer 19 is formed from the major face of the N-type well layer 111. A reference numeral 22 designates a thick insulation film, such as LOCOS local oxide film. An anode region 130 consisting of a P-type well, which is separated from the N-type well layer 111 of the second conductivity type, is selectively disposed underneath the drain contact layer 20 more deeply than the N-type base layer 19. As shown in FIG. 1, the second P-type base layer 23 is folded like comb teeth on the chip as shown in FIG. 11 and defines the boundary between the MOS portion 125 and the drain portion 126. The MOS portion 125, including the source pad 16b, is formed outside the boundary, i.e., the second P-type base layer 23, while the drain portion 126 including a drain pad 121b is formed inside the boundary. The drain pad 121b is formed in a circle and surrounded by the drain electrode 121 connected with the drain contact layer 20. The field plate portion 121a occupies the peripheral portion of the drain electrode 121. As a result, the anode region 130 is annular and surrounds the drain pad 121b.

In this embodiment, a pitch $T_1$ between the folded source and drain is about 120 μm wide for a withstand voltage of around 600 V. The diameter $T_2$ of the drain pad 121b is set at 240 μm based on the accuracy of wire bonding. Thus, the drain pad 121b is surrounded by the annular anode region 130, which has a width of about 120 μm.

The semiconductor structure described above is manufactured by the following steps. The N-type well layer 111 and the P-type anode region 130, both having a diffusion depth of about 6 μm, are formed by doping phosphorus and boron from the major face of the semiconductor substrate 10 by ion implantation followed by driving. Then, the N-type base layer 19 having a diffusion depth of about 6 μm is formed in a region which includes the anode region 130. By these steps, a junction diode is formed with the anode region 130 and the N-type base layer 19. In the process, the first and the second base layers 12 and 23 are formed by the boron doping and the simultaneous driving. Then, the field oxide film 22 and the poly-silicon gate electrode 15 are deposited. The N⁺-type source layer 13 is formed by using the gate electrode 15 as a mask for self alignment and the N⁺-type base contact 20 is formed simultaneously. After the inter-layer insulation film 17 is formed, contact holes are produced through the insulation film 17, and then the electrodes 16 and 121 are deposited. Finally, a passivation film 18 is deposited.

Figure 3:
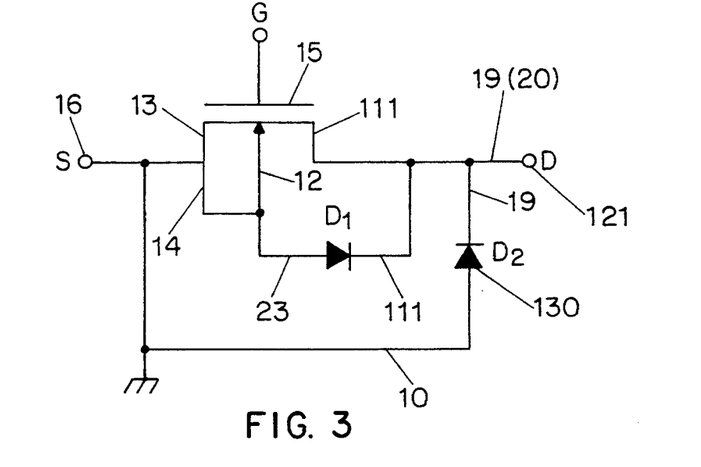
FIG. 3 is a circuit diagram for an equivalent circuit of the semiconductor structure of FIG. 1.

FIG. 3 is a circuit diagram showing an equivalent circuit of the above described semiconductor structure which is formed by providing a conventional transverse DMOSFET with a P-type anode region 130 underneath the drain electrode 121. The source layer 13 and the N-type well layer 111 act as a drain region, while the N-type base layer 19, the base contact layer 20, and the gate electrode 15 constitute a transverse power MOSFET. The first base layer 12 is a P-type region which separates an N-type source region from a drain region and constitutes a backgate. The second base layer 23 is connected with the first base layer 12. Since the second base layer 23 covers the N-type well layer 111, the second base layer 23 in the offset region and the N-type well layer 111 constitute a junction transistor $D_1$. Though the circuit configuration described so far is the same as in the prior art, the deep P-type well-like anode region 130 separated from the N-type well layer 111 is added to this embodiment of the present invention.

The back surface of the semiconductor substrate 10 is bonded to a die pad of a lead frame usually with adhesive. The die pad is maintained at ground potential. Thus, the P-type anode region 130 and the N-type base layer 19 constitute another junction diode $D_2$ different from the junction transistor $D_l$. Though the semiconductor substrate 10 is directly bonded to the die pad with adhesive in this embodiment, the semiconductor substrate 10 may be soldered with the die pad through an aluminum back electrode which covers the entire back surface of the semiconductor substrate 10.

The operation of the embodied semiconductor device will be explained below.

1. When the MOSFET is ON

When the potential of the gate electrode 15 is raised above the source potential and the drain electrode is biased with a high potential, an inversion layer is formed in the surface of the first base layer 12 underneath the gate electrode 15. Electrons, the majority carrier, flow out from the source layer 13 to the N-type well layer 111 under the gate electrode 15 through a channel. Similarly as in a vertical DMOSFET, the electrons flow downward in the N-type well layer 111 under the gate electrode 15, and then flow horizontally in the N-type well layer 111 to the N-type base layer 19, i.e., the drain layer. The electrons which have reached the N-type base layer 19 are absorbed by the drain electrode 121 through the drain contact layer 20. Since the P-type base layer 23 is covered with the N-type well layer 111, the junction between the N-type well layer 111 and the P-type base layer 23 is reverse-biased. As a result, the electrons drifting in the N-type well layer 111 make no contact with the insulation layer 22, and any influence due to hot electrons can be ignored.

2. When the MOSFET is OFF

When the forward current flow is shut off, i.e., when the gate electrode 15 is biased with low potential, such as the source potential or ground potential, while the drain electrode 121 is biased with the high potential, since the PN junction between the first P-type base layer 12 or the second P-type base layer 23 and the N-type well layer 111, and the junction between the N-type well layer 111 and the P-type semiconductor substrate 10 are reverse-biased, depletion layers spread from these junctions into the N-type well layer 111. With the depletion layers spreading from the first P-type base layer 12 and the substrate 10 on the side of the N-type base layer 19, the inside of the well layer 111 under the gate electrode 15 is pinched off, and the current path is shut off as in a JFET. If the depletion layers spread from the second P-type base layer 23 and the substrate 10, the inside of the well layer 111 under the second P-type base layer 23 is pinched off also, shutting off the current path as in a JFET. Thus also, the current path is assuredly shut off inside the well layer 111, by the JFET effect of the second P-type base layer 23 when the reverse bias is applied. As a result, for securing the withstand voltage, it is not necessary to elongate the lightly doped offset region of the N-type well layer 111. Thus, the MOSFET can be provided with a higher withstand voltage and its ON-resistance can be lowered by relatively heavy doping of the N-type well layer 111.

Since the diode $D_2$ is formed with the anode region 130 and the N-type base layer 19, a depletion layer spreads also from the junction of the diode $D_2$ when the forward current flow is shut off. Because of this, a portion 124 in which breakdown occurs at first lies on the junction between the anode region 130 and the N-type base layer 19, and the breakdown occurs in a plane. Thus, the diode $D_2$, which comprises the anode region 130 and the N-type base layer 19, functions as a withstand voltage limiter or sacrifice diode. Most of the depletion layer spreading from the junction of the diode $D_2$ reaches the P-type semiconductor substrate 10 with high resistivity at around 100 Ω·cm. Thus, the depletion layer is prevented from spreading toward the surface of the chip by the relatively heavily doped N-type base layer 19. As a result, the electrons produced by the breakdown reach the N-type well to generate a current flow, while the holes produced by the breakdown flow into the back electrode through the P-type semiconductor substrate 10. The breakdown current is then discharged rapidly through the drain electrode 121 and the back electrode. A suitable structure can be made by polishing the back surface of a 500 μm thick wafer on which the semiconductor structure has been formed, to a thickness of around 300 μm, depositing a contact, or back electrode, on the back surface of the polished wafer, bonding the back electrode to a die pad of a lead frame, and biassing the substrate at the same potential with the source potential or ground potential. The parasitic resistance of the discharging path is suppressed low enough to minimize internal heat generation. Since the portion 124, in which the breakdown occurs, occupies an area instead of a spot, the current cross section, and the current capacity are enlarged. Therefore, the withstand capability against the avalanche caused by an inductance load L when the current is shut off is improved.

Figure 4:
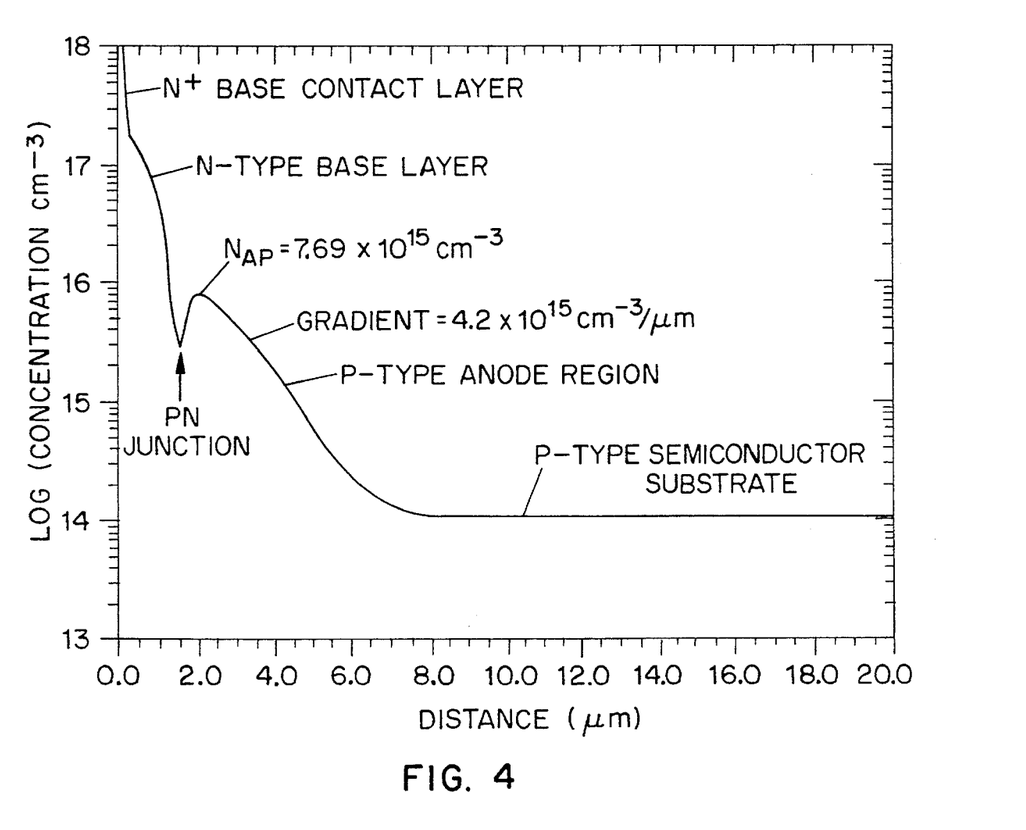
FIG. 4 is a chart showing the impurity distribution along b–b' of FIG. 2.

FIG. 4 is a chart showing the impurity distribution along b–b' of FIG. 2. The origin of the abscissa of FIG. 4 is set at the major face of the N+-type base contact layer 20. As shown in FIG. 4, the PN junction between the N-type base layer 19 and the P-type anode layer 130 lies at a depth of about 1.3 μm.

Figure 5:
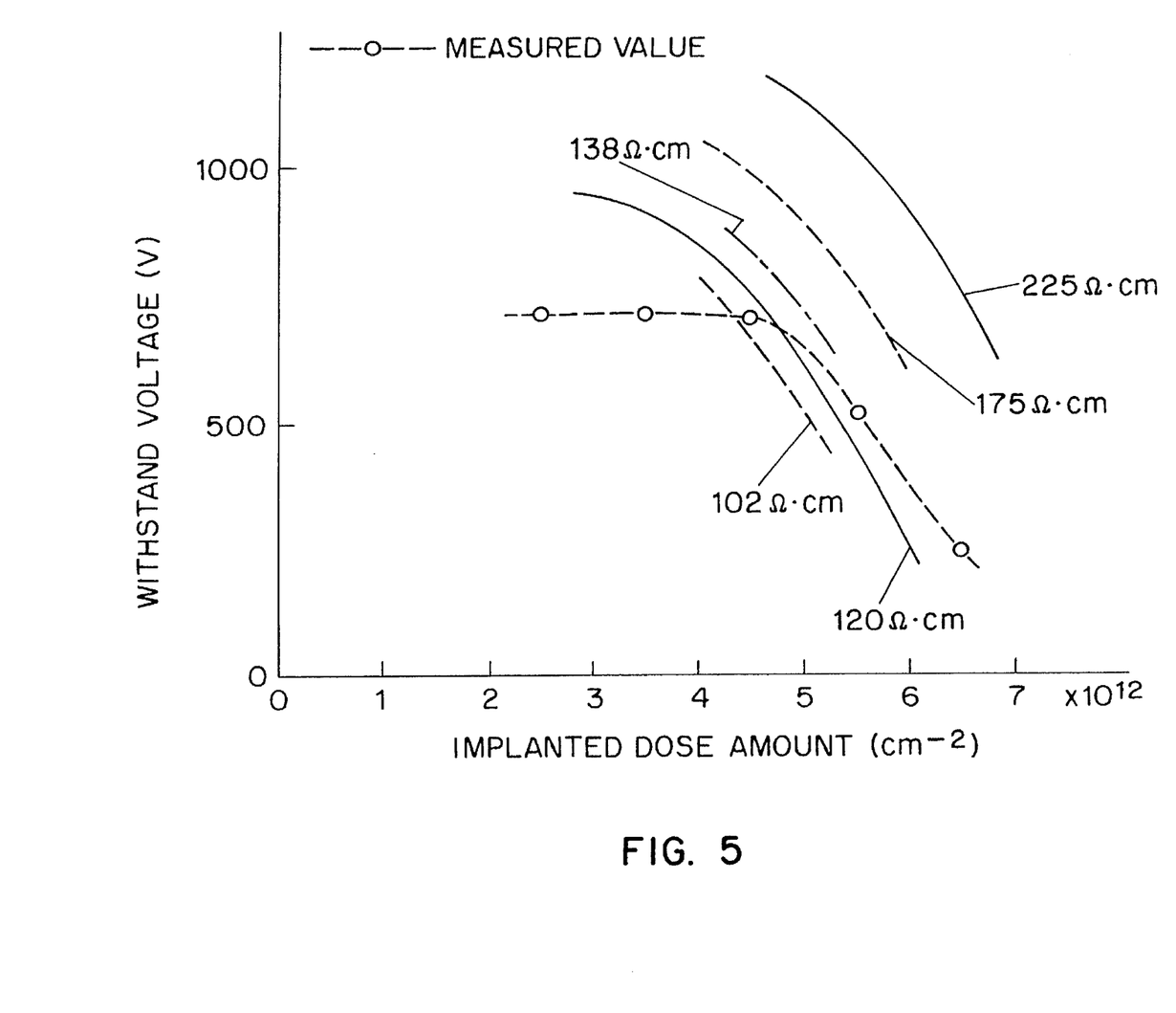
FIG. 5 is a chart showing the result of device simulation, for illustrating the relation between the implanted dose amount in the anode region of the diode $D_2$ and the withstand voltage of the diode $D_2$.

FIG. 5 is a chart showing the result of device simulation for illustrating the relation between the implanted dose amount in the anode region of the diode $D_2$ and the withstand voltage of the diode $D_2$. In simulations, the resistivity of the P-type semiconductor substrate 10 is set at 102 Ω·cm, 122 Ω·cm, 138 Ω·cm, 157 Ω·cm, and 225 Ω·cm. The withstand voltage of the diode $D_2$ lowers with increasing dose amount. Also shown in FIG. 5 are measured values of withstand voltage of semiconductor device prototypes. As the measured values show, the withstand voltage of the main power MOSFET of the prototypes, in which the main power MOSFET is connected in parallel with the diode $D_2$ as shown in FIG. 3, is lower than the withstand voltage of the diode $D_2$ when the implanted dose is less than $4.5 \times 10^{12}$ cm. As a result, the diode $D_1$ breaks down prior to the diode $D_2$ which represents the breakdown generation portion 124. But when the dose is set at $4.5 \times 10_{12}$ cm or more, the diode $D_2$ breaks down before the diode $D_1$ which represents the main power MOSFET, so that anticipated difficulties, e.g., due to withstand voltage variation are alleviated.

Figure 6:
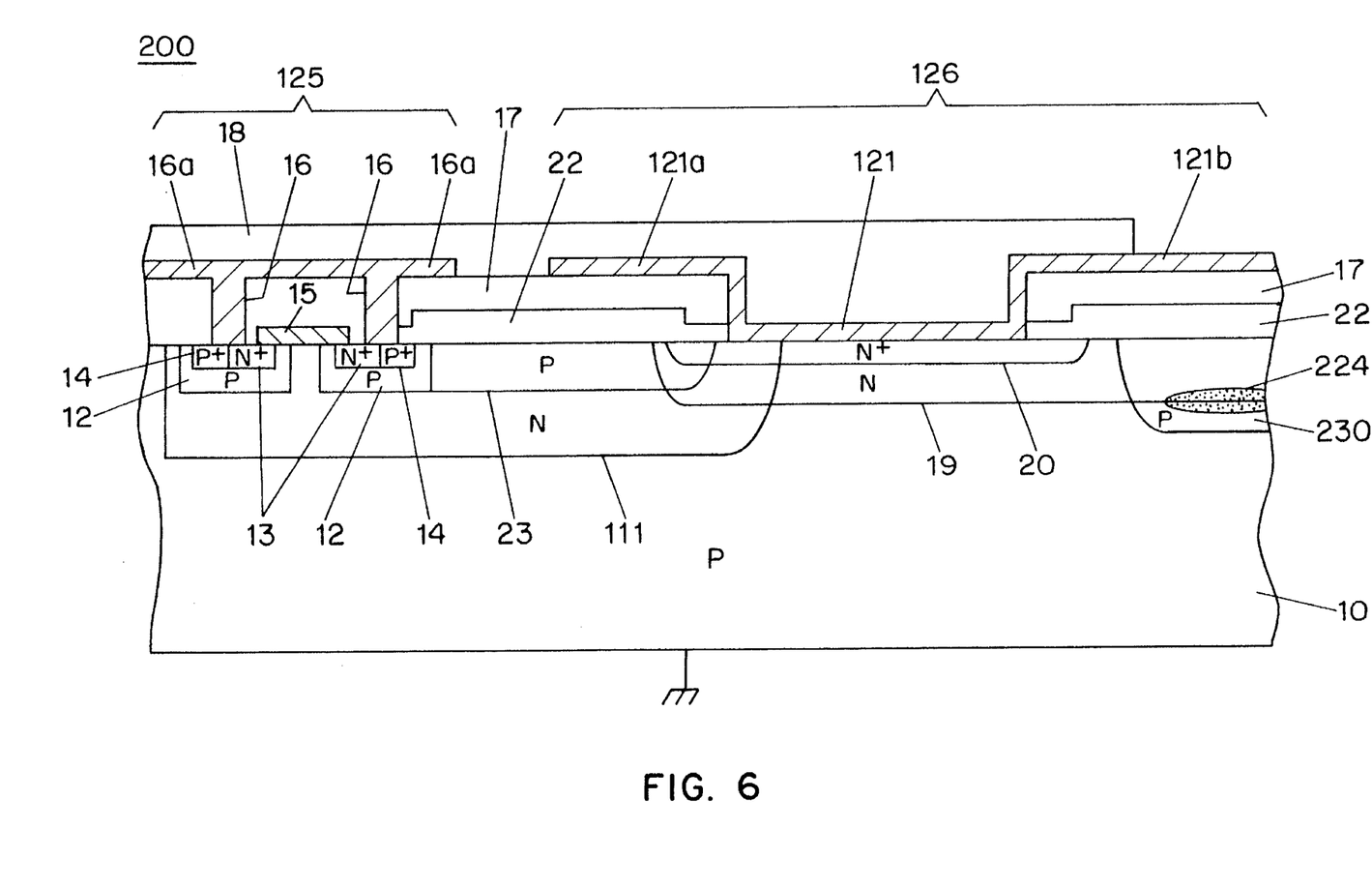
FIG. 6 is a sectional view showing a second embodiment of a power IC with a transverse DMOSFET according to the present invention.

FIG. 6 is a sectional view showing the second embodiment of a power IC according to the present invention. In FIG. 6, parts like those in FIG. 2 are designated by the same reference numerals. The semiconductor device 200 of the second embodiment differs from the semiconductor device 100 of the first embodiment in that a P-type anode region 230 is disposed underneath the drain pad 121b instead of underneath the drain electrode 121. As a result, the element area for the main power MOSFET can be located near the periphery of the drain pad 121b. Reference numeral 224 designates a breakdown generation portion.

Figure 7:
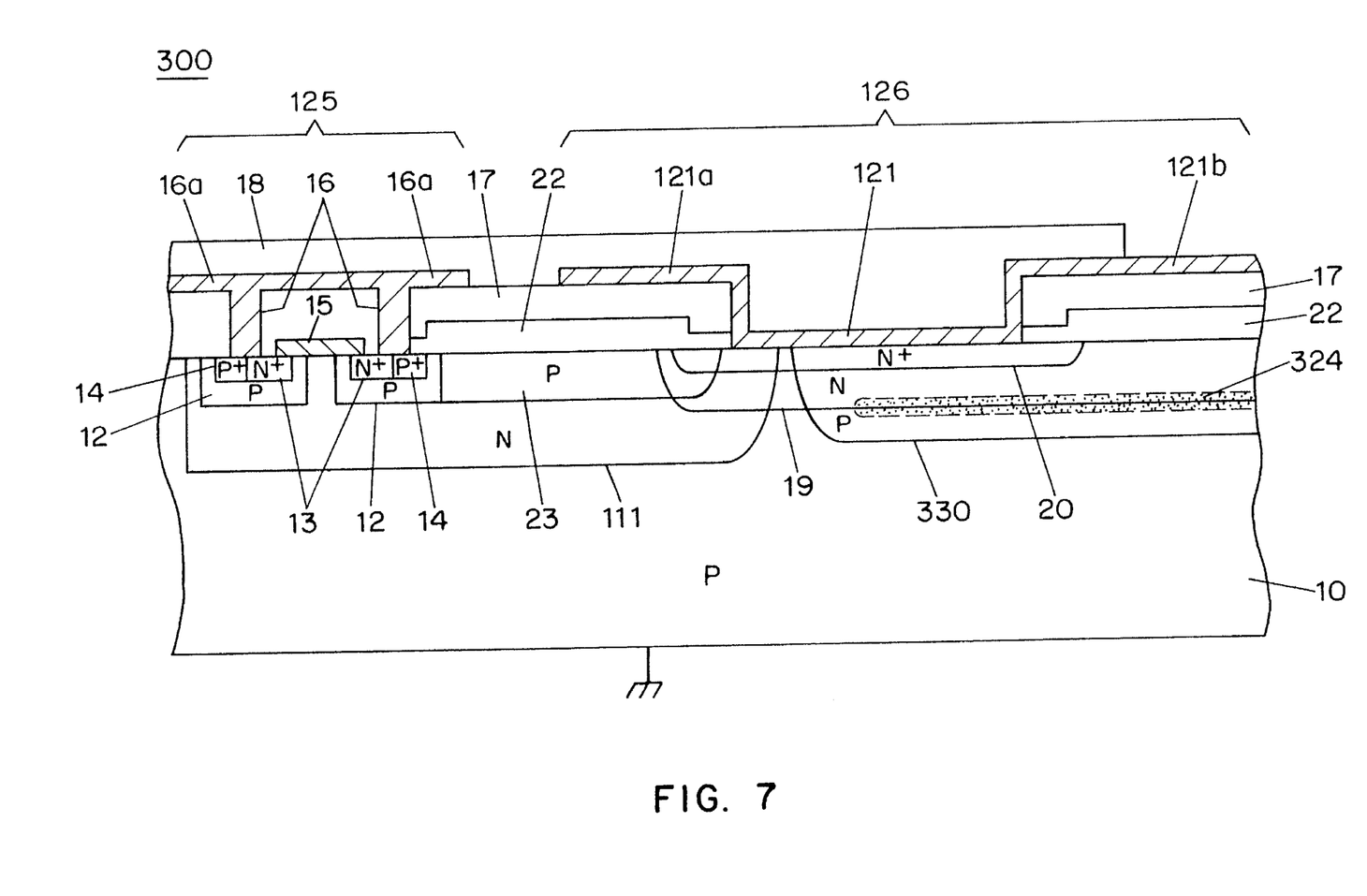
FIG. 7 is a sectional view showing a third embodiment of a power IC with a transverse DMOSFET according to the present invention.

FIG. 7 is a sectional view showing the third embodiment of a power IC according to the present invention. In FIG. 7, parts like those in FIG. 2 are designated by the same reference numerals. The semiconductor device 300 of the third embodiment differs from the semiconductor device 100 of the first embodiment in that a P-type anode region 324 is disposed underneath the drain electrode 121 and the drain pad 121b. Since the junction diode $D_2$ or the breakdown generation portion 324 can occupy a larger area than that of the breakdown generation portion of FIG. 2 or 6, the avalanche withstand capability is improved.

Figure 8:
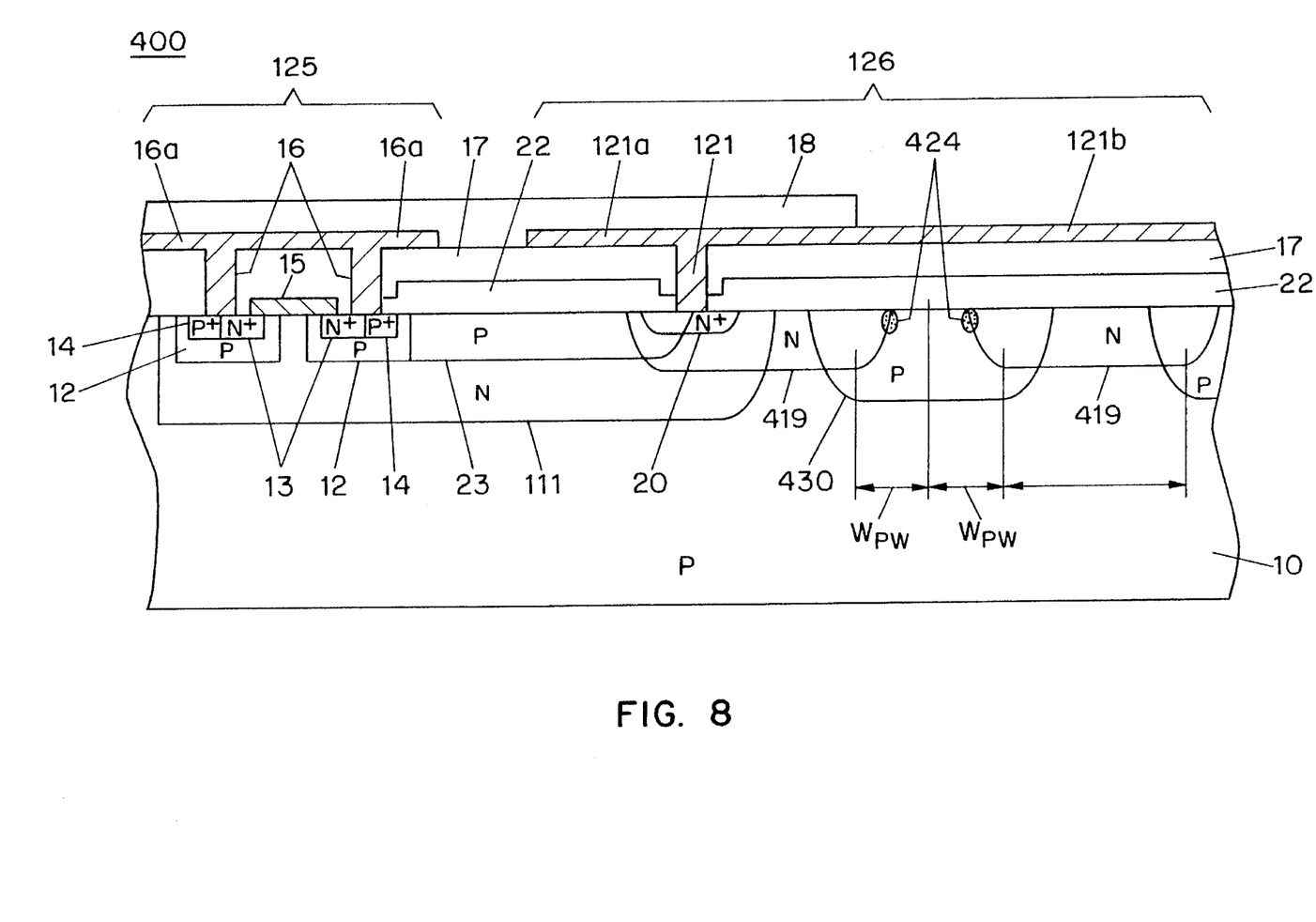
FIG. 8 is a sectional view showing a fourth embodiment of a power IC with a transverse DMOSFET according to the present invention.
Figure 9A:
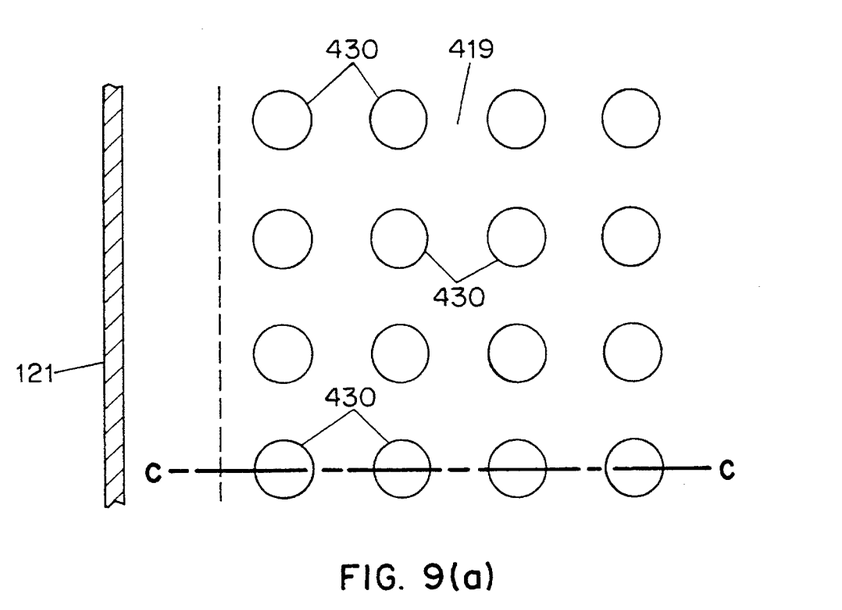
FIG. 9(a) is a top plan view showing the drain portion 126 of the fourth embodiment.
Figure 9B:
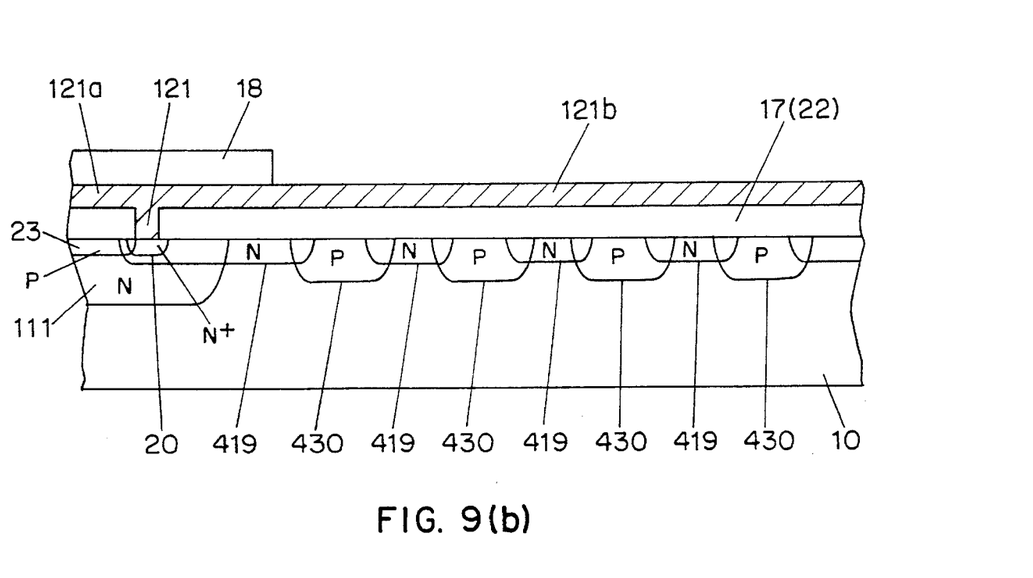
FIG. 9(b) is a sectional view taken along c–c' of FIG. 9(a)

FIG. 8 is a sectional view showing the fourth embodiment of a power IC according to the present invention. FIG. 9(a) is a top plan view showing the drain portion 126 of the fourth embodiment, and FIG. 9(b) is a sectional view taken along c–c' of FIG. 9(a).

In the semiconductor device 400 of the fourth embodiment, a plurality of P-type well regions 430 are formed using the mask pattern alignment technique so as to overlap with a plurality of N-type base layers 419 with each other. As shown in FIG. 9(a), N-type base layers 419 are formed underneath the drain pad 121b with scattered undoped regions in between, and P-type anode regions 430 are formed across the N-type base layers 419 in the undoped regions. Thus, a junction is formed in a region in which edge portions of the P-type anode regions 430 and the N-type base layers 419 overlap. Therefore, breakdown occurs in portions 424 on the edge surface of the heavily doped $N^{31}$-type base layers 419. Since the PN junction is perpendicular to the chip surface in the breakdown generation portion 424, and since the electric field direction is substantially parallel to the chip surface, few carriers produced by the breakdown are injected into the oxide film 22. As a result, there is little time dependent variation of the withstand voltage. Since the N-type base layer 419 is formed around the circular P-type well-like anode region 430, the junction area of the diode $D_2$ is wide enough to give larger avalanche withstand capability for the induction load.

Figure 10:
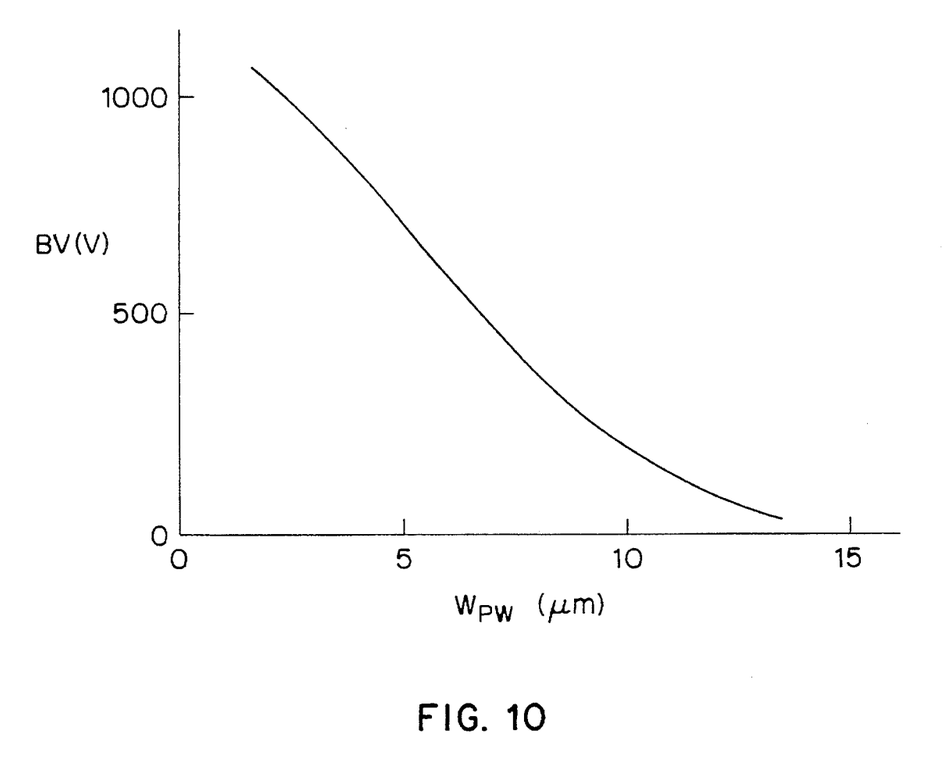
FIG. 10 is a chart showing the simulated relation between the radius $W_{pw}$ of a circular P-type well-like anode region and the withstand voltage BV of the diode.

FIG. 10 is a chart showing the simulated relation between the radius $W_{PW}$ of the circular P-type well anode region and the withstand voltage BV of the diode. The withstand voltage BV of the diode $D_2$ decreases monotonically with increasing radius $W_{PW}$ of the P-type anode region. For fixed impurity distribution of the P-type anode region 430 and the N-type base region 419 at a predetermined profile, the radius $W_{PW}$ of the P-type anode region determines the withstand voltage, conveniently as a function of the mask pattern.

Though the P-type anode regions 430 are formed underneath the drain pad 121b in FIG. 8, the P-type anode regions 430 may be formed underneath the base contact layer 20, i.e. underneath the periphery of the drain pad 121b. The P-type anode regions 430 may also be formed underneath the drain pad 121b and its periphery.

The semiconductor device according to the present invention provides the main power MISFET with a limiter, or sacrifice, diode by forming a well region of the first conductivity type in the drain of the second conductivity type so that the sacrifice diode assuredly breaks down before the main power MISFET breaks down. This is advantageous for the following reasons:

(1) Since the withstand voltage of the MIS field effect transistor can be set at a predetermined value and its time dependent variation can be suppressed, a highly reliable MIS field effect transistor is obtained;

(2) Since the PN junction of the sacrifice diode lies in a plane, the current cross section, the current capacity, and therefore the withstand capability against avalanche caused by an inductive load when the current is shut off are improved;

(3) Since the PN junction of the sacrifice diode is perpendicular to the chip surface, and with the electric field direction parallel to the chip surface, few electrons are injected into the insulation film disposed on the chip surface. As a result, any time dependent variation of the withstand voltage is negligible;

(4) With a flat and annular well region of the first conductivity type surrounding a circular drain pad, an element area is effectively provided for the main MISFET, the PN junction area is widened, and inclusion of a sacrifice diode is facilitated whose withstand voltage is lower than the withstand voltage of the main MISFET; and (5) Since a sacrifice diode is formed without diminishing the element area of the main MISFET of the semiconductor device, in which a circular well region of the first conductivity type is formed underneath the circular drain pad, the current capacity can be enlarged.

We claim:

1. A semiconductor device comprising:

a semiconductor substrate of a first conductivity type;

a well region of a second conductivity type formed from a major surface of the semiconductor substrate;

a pair of first base layers of the first conductivity type formed in the well region;

a pair of respective source layers of the second conductivity type formed in the first base layers;

a gate electrode on a gate insulation film, coupled with the first base layers as a back gate and bridging the source layers over the well region;

a drain region of the second conductivity type formed from the major surface of the semiconductor substrate, connected with an edge portion of the well region;

a second base layer of the first conductivity type formed from a surface of the well region, bridging one of the first base layers and the drain region; and a further well region, of the first conductivity type, contacting an edge portion of the drain region.

2. The semiconductor device of claim 1, wherein the further well region forms a ring around a circular drain pad.

3. The semiconductor device of claim 1, wherein the further well region forms a circle underneath a circular drain pad.

4. The semiconductor device of claim 1, wherein the further well region forms a circle underneath and around a circular drain pad.

5. A semiconductor device comprising:

a semiconductor substrate of a first conductivity type;

a well region of a second conductivity type formed from a major surface of the semiconductor substrate;

a pair of first base layers of the first conductivity type formed in the well region;

a pair of respective source layers of the second conductivity type formed in the first base layers;

a gate electrode formed on a gate insulation film, coupled with the first base layers as a back gate and bridging the source layers over the well region;

a drain region of the second conductivity type formed from the major surface of the semiconductor substrate, connected with an edge portion of the well region;

a second base layer of the first conductivity type formed from a surface of the well region, bridging one of the first base layers and the drain region;

a circular drain pad formed on an insulation film on a portion of the drain region; and a further well region, of the first conductivity type, formed between the semiconductor substrate and the drain region such that the further well region forms a ring around the drain pad.

6. A semiconductor device comprising:

a semiconductor substrate of a first conductivity type;

a well region of a second conductivity type formed from a major surface of the semiconductor substrate;

a pair of first base layers of the first conductivity type formed in the well region;

a pair of respective source layers of the second conductivity type formed in the first base layers;

a gate electrode formed on a gate insulation film, coupled with the first base layers as a back gate and bridging the source layers over the well region;

a drain region of the second conductivity type formed from the major surface of the semiconductor substrate, connected with an edge portion of the well region;

a second base layer of the first conductivity type formed from a surface of the well region, bridging one of the first base layers and the drain region;

a circular drain pad formed on an insulation film on a portion of the drain region; and a further well region, of the first conductivity type, formed between the semiconductor substrate and the drain region such that the further well region forms a circle underneath the drain pad.

7. A semiconductor device comprising:

a semiconductor substrate of a first conductivity type;

a well region of a second conductivity type formed from a major surface of the semiconductor substrate;

a pair of first base layers of the first conductivity type formed in the well region;

a pair of respective source layers of the second conductivity type formed in the first base layers;

a gate electrode formed on a gate insulation film, coupled with the first base layers as a back gate and bridging the source layers over the well region;

a drain region of the second conductivity type formed from the major surface of the semiconductor substrate, connected with an edge portion of the well region;

a second base layer of the first conductivity type formed from a surface of the well region, bridging one of the first base layers and the drain region;

a circular drain pad formed on an insulation film on a portion of the drain region; and a further well region, of the first conductivity type, formed between the semiconductor substrate and the drain region such that the further well region forms a circle underneath and around the drain pad.

8. The semiconductor device of claim 1, 2, 3, 4, 5, 6 or 7, wherein the drain region has a boundary which is configured as a comb-tooth pattern.

* * * * *